United States Patent
Liu et al.

(10) Patent No.: US 12,442,692 B2
(45) Date of Patent: Oct. 14, 2025

(54) TEMPERATURE MONITORING APPARATUS AND BATTERY MODULE HAVING SAME

(71) Applicants: Viridi E-Mobility Technology (Ningbo) Co., Ltd., Zhejiang (CN); ZHEJIANG GEELY HOLDING GROUP CO., LTD., Zhejiang (CN)

(72) Inventors: Yi Liu, Zhejiang (CN); Fuzhong Pan, Zhejiang (CN); Li Zhan, Zhejiang (CN); Songtai Zheng, Zhejiang (CN); Huiming Li, Zhejiang (CN); Liguan Wang, Zhejiang (CN); Hebin Zhang, Zhejiang (CN)

(73) Assignees: Viridi E-Mobility Technology (Ningbo) Co., Ltd., Zhejiang (CN); ZHEJIANG GEELY HOLDING GROUP CO., LTD., Zhejiang (CN)

( * ) Notice: Subject to any disclaimer, the term of this patent is extended or adjusted under 35 U.S.C. 154(b) by 535 days.

(21) Appl. No.: 18/004,871

(22) PCT Filed: Jul. 9, 2020

(86) PCT No.: PCT/CN2020/100963
§ 371 (c)(1),
(2) Date: Jan. 9, 2023

(87) PCT Pub. No.: WO2022/006801
PCT Pub. Date: Jan. 13, 2022

(65) Prior Publication Data
US 2023/0243707 A1    Aug. 3, 2023

(51) Int. Cl.
*G01K 1/143* (2021.01)
*G01K 1/14* (2021.01)
*H01M 10/48* (2006.01)

(52) U.S. Cl.
CPC ............ *G01K 1/14* (2013.01); *H01M 10/486* (2013.01)

(58) Field of Classification Search
CPC ........ H01M 10/486; G01K 1/143; G01K 1/18
See application file for complete search history.

(56) References Cited

U.S. PATENT DOCUMENTS 10,458,859 B2 * 10/2019 Shih .................. G01K 7/24
2018/0045576 A1    2/2018 Wang et al.

FOREIGN PATENT DOCUMENTS

| CN | 205192650 U | 4/2016 |
| CN | 208904177 U | 5/2019 |

(Continued)

OTHER PUBLICATIONS

European Patent Office, Extended European Search Report Issued in Application No. 20944742.4, Jul. 13, 2023, Germany, 18 pages.

(Continued)

*Primary Examiner* — Kevin E Yoon
(74) *Attorney, Agent, or Firm* — McCoy Russell LLP

(57) ABSTRACT

A temperature monitoring apparatus and a battery module having the temperature monitoring apparatus. The temperature monitoring apparatus comprises an isolation plate, a connecting aluminum bar, a flexible printed circuit board, and a temperature measuring assembly. A first mounting frame and a second mounting frame are provided on the isolation plate. The connecting aluminum bar is embedded in the first mounting frame. The flexible printed circuit board is laid on the surface of the isolation plate in a manner of partially overlapping with the second mounting frame. The temperature measuring assembly is provided on the part of the flexible printed circuit board where the flexible circuit board overlaps the second mounting frame.

18 Claims, 3 Drawing Sheets

(56) References Cited

FOREIGN PATENT DOCUMENTS

| CN | 110398295 | A | | 11/2019 | |
|----|-----------|---|---|---------|---|
| CN | 210221342 | U | * | 3/2020 | |
| CN | 111189558 | A | | 5/2020 | |
| CN | 210778884 | U | | 6/2020 | |
| DE | 102016207334 | A1 | * | 11/2017 | .......... H01M 10/486 |

OTHER PUBLICATIONS

European Patent Office, Office Action Issued in Application No. 20944742.4, Jan. 20, 2025, Netherlands, 4 pages.

ISA State Intellectual Property Office of the People's Republic of China, International Search Report Issued in Application No. PCT/CN2020/100963, Mar. 25, 2021, WIPO, 5 pages.

ISA State Intellectual Property Office of the People's Republic of China, Written Opinion of the International Searching Authority Issued in Application No. PCT/CN2020/100963, Mar. 25, 2021, WIPO, 5 pages. (Submitted with Machine/Partial Translation).

* cited by examiner

TEMPERATURE MONITORING APPARATUS AND BATTERY MODULE HAVING SAME

CROSS REFERENCE TO RELATED APPLICATION

This application is a US National Phase of a PCT Application No. PCT/CN2020/100963 filed on Jul. 9, 2020, the entire contents of which are incorporated herein by reference in their entireties.

TECHNICAL FIELD

The present disclosure relates to battery systems, in particular to a temperature monitoring apparatus and a battery module including the temperature monitoring apparatus.

BACKGROUND

Currently, a module sampling assembly is increasingly being utilized to increase automation, improve the stability of module sampling and reduce costs. The structure of the module sampling assembly as shown in FIG. 1, and includes a Flexible Printed circuit board (FPC), an aluminum bar for connection, a conductive sheet and a temperature sensor. The temperature sensor on the FPC is generally welded at the position where the FPC connects to the conductive sheet, and the aluminum bar for connection is connected to the poles of two battery cells. The temperature of the battery cells is transmitted to the conductive sheet through the aluminum bar for connection, and the temperature sensor determines the temperature of the module by monitoring the temperature of the conductive sheet.

However, this temperature sampling method has two obvious defects: (1) the temperature of the aluminum bar for connection does not truly reflect the temperature of the battery cells, especially in the case of large discharge rate, the temperature change of the aluminum bar for connection is significantly larger than the temperature change of the battery cells, so the temperature of the module cannot be accurately determined by collecting the temperature on the aluminum bar; (2) the temperature sensor is welded at the junction of the conductive sheet and the FPC, and the fillet weld leg of the temperature sensor is very close to the conductive sheet, so there is a risk of short circuit between the temperature sensor and the sampling point of the conductive sheet.

SUMMARY

The present disclosure describes a temperature monitoring apparatus, the temperature monitoring apparatus includes an isolation plate, an aluminum bar for connection, a flexible printed circuit board and a temperature measurement assembly; wherein a first mounting frame and a second mounting frame are on the isolation plate the aluminum bar for connection is embedded into the first mounting frame the flexible printed circuit board is laid on the surface of the isolation plate in a way that the flexible printed circuit board partially overlaps with the second mounting frame the temperature measurement assembly is on the flexible printed circuit board and at an overlapping part of the flexible printed circuit board and the second mounting frame a heat conducting pad of the temperature measurement assembly extends out the second mounting frame and the temperature sensor of the temperature measurement assembly is close to the heat conducting pad wherein when the aluminum bar for connection is connected to a device to be monitored through a part of the aluminum bar for connection exposed from the first mounting frame the heat conducting pad is attached to the device to be monitored.

In an embodiment, the temperature measurement assembly further comprises a reinforcement plate a first hollow part is in the reinforcement plate the flexible printed circuit board is located between the reinforcement plate and the heat conducting pad and the temperature sensor is located in the first hollow part of the reinforcement plate In an embodiment, the temperature measurement assembly further comprises a reinforcement plate the heat conducting pad is provided with a second hollow part the flexible printed circuit board is located between the reinforcement plate and the heat conducting pad and the temperature sensor is located in the second hollow part of the heat conducting pad In an embodiment, the temperature sensor is connected to the flexible printed circuit board The present disclosure has following advantages: the temperature of the device to be monitored is conducted through the heat conducting pad, and the temperature value of the device to be monitored is obtained by using the temperature measurement assembly near the heat conducting pad, which significantly shortens the heat transfer path and makes the temperature value monitored by the temperature measurement assembly closer to the actual temperature of the device to be monitored, and the temperature sampling is more accurate. The heat of the device to be monitored is directly conducted by the heat conducting pad without the need to connect the aluminum bar, thus avoiding the problem that the temperature change of the aluminum bar is not consistent with the temperature change of the device to be monitored in a case of large discharge rate, resulting in the temperature collected indirectly through the aluminum bar not accurately reflecting the actual temperature of the device to be monitored.

The present disclosure further describes a battery module including, an battery cell and an above-mentioned temperature monitoring apparatus, wherein an electrode is on the battery cell the electrode is fixed to the aluminum bar for connection in the first mounting frame of the temperature monitoring apparatus, and the heat conducting pad of the temperature monitoring apparatus is closely attached to the battery cell Advantages: transferring the heat of the battery cell through the heat conducting pad, shortens the heat transfer path, makes the temperature of the battery cell collected by the temperature sensor more accurate, and the position of the temperature sensor is not limited by the position of the conductive sheet, thus the position setting is more flexible. In addition, since the temperature sensor is separated from the conductive sheet, the risk of a short circuit between the fillet weld leg of the temperature sensor and the conductive sheet due to the entry of water vapor when glue splits or layers in use is avoided, and there is no need to specially process a hollow part for welding the temperature sensor on the conductive sheet, which simplifies the process of laminating the PI (Polyimide) film.

BRIEF DESCRIPTION OF THE DRAWINGS

In order to more clearly illustrate the technical solutions and advantages of the embodiments in the present disclosure or prior art, the accompanying drawings required for describing the embodiments or the prior art will be briefly introduced below. Obviously, the accompanying drawings in the following description are only some embodiments of the present disclosure. For those of ordinary skill in the art, other drawings can also be obtained from these drawings without any creative effort.

Figure 1:
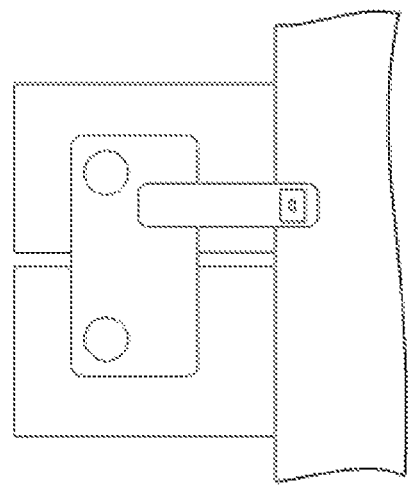
FIG. 1 is a schematic structure diagram of a module sampling assembly in the prior art.

In the accompanying drawings, reference numerals are attached as follows: battery cell 1, flexible printed circuit board 2, isolation plate 3, first mounting frame 31, second mounting frame 32, aluminum bar 4 for connection, temperature measurement assembly 5, reinforcement plate 51, first hollow part 52 temperature sensor, 53, heat conducting pad 54, second hollow part 55, conductive sheet 6, electrode 7.

DETAILED DESCRIPTION OF THE EMBODIMENTS

To enable those in the art to better understand the solution of the present disclosure, the technical solutions according to embodiments of the present disclosure will be described below in conjunction with the accompanying drawings according to embodiments of the present disclosure.

It should be noted that the terms "first", "second", etc. in the specification, claims and the above-mentioned drawings of the present disclosure are used to distinguish similar objects and are not used to describe a particular order or sequence. Terms "include", "comprise", and any variations thereof, are intended to cover non-exclusive inclusion. In different embodiments, the same components have the same reference numeral.

As a general inventive concept, the present disclosure describes a temperature monitoring apparatus including an isolation plate 3, an aluminum bar 4 for connection, a flexible printed circuit board 2 and a temperature measurement assembly 5; where a first mounting frame 31 and a second mounting frame 32 are provided on the isolation plate 3, the aluminum bar 4 for connection is embedded into the first mounting frame 31, the flexible printed circuit board 2 is laid on the surface of the isolation plate 3 in a way that the flexible printed circuit board 2 partially overlaps with the second mounting frame 32, the temperature measurement assembly 5 is provided on the flexible printed circuit board and at a position where the flexible printed circuit board and the second mounting frame 32 overlaps, a heat conducting pad 54 of the temperature measurement assembly extends out the second mounting frame 32, the temperature sensor 53 of the temperature measurement assembly is close to the heat conducting pad 54, and when the aluminum bar 4 for connection is connected to a device to be monitored through a part of the aluminum bar 4 for connection exposed from the first mounting frame 31, the heat conducting pad 54 is attached to the device to be monitored.

The above structure has the advantage that the temperature of the device to be monitored is conducted through the heat conducting pad and the temperature value of the device to be monitored is obtained by the temperature measurement assembly near the heat conducting pad, which greatly shortens the heat transfer path and makes the temperature value monitored by the temperature measurement assembly closer to the actual temperature of the device to be monitored, such that the temperature sampling is more accurate. The temperature of the device to be monitored is conducted directly by the heat conducting pad without the aluminum bar for connection to conduct heat, thus avoiding the problem that the temperature change of the aluminum bar for connection is not consistent with the temperature change of the device to be monitored in the case of large discharge rate, resulting in the temperature collected indirectly through the aluminum bar for connection not accurately reflecting the actual temperature of the device to be monitored.

In an embodiment, the temperature measurement assembly may further include a reinforcement plate. The temperature measurement assembly 5 further includes a reinforcement plate 51, the reinforcement plate 51 is provided with a first hollow part 52, the flexible printed circuit board 2 is located between the reinforcement plate 51 and the heat conducting pad 54, the temperature sensor 53 is connected to the flexible printed circuit board 2 and located in the first hollow part 52 of the reinforcement plate 51. The reinforcement plate is provided to facilitate the attachment of the flexible printed circuit board to the second mounting frame and to provide mounting support for the temperature sensor. The flexible printed circuit board includes a connecting part, the temperature sensor is welded to the connecting part of the flexible printed circuit board, and the temperature sensor is located in the first hollow part of the reinforcement plate. The temperature sensor is located in the first hollow part, which shortens the distance between the temperature sensor and the heat conducting pad, reduces the heat transfer loss, and improves the accuracy of the temperature sensor in monitoring the temperature of the device to be monitored. The temperature sensor is welded in the hollowed-out position in the center of the reinforcing plate, and the reinforcing plate plays the role of protecting the temperature sensor, thereby greatly reducing the risk of damage to the temperature sensor.

In another embodiment, the temperature measurement assembly 5 may further include a reinforcement plate 51, a heat conducting pad 54 is provided with a second hollow part 55, a flexible printed circuit board 2 is located between the reinforcement plate 51 and the heat conducting pad 54, and a temperature sensor 53 is connected to the flexible printed circuit board 2 and located in the second hollow part 55 of the heat conducting pad 54. In an example, the temperature sensor is welded to the connecting part of the flexible printed circuit board, and the temperature sensor is located in the second hollow portion of the heat conducting pad. In this way, the heat transfer path from the device to be monitored to the temperature sensor is further shortened, which improves the accuracy of the temperature sensor to monitor the temperature of the device to be monitored. The temperature sensor is located in the second hollow part, and the heat conducting pad also plays the role of protecting the temperature sensor.

A first positioning structure can be provided on a frame edge of the second mounting frame 32, and a second positioning structure is provided on an overlapping position of the flexible printed circuit board 2 and the second mounting frame 32, and the second positioning structure corresponds to the first positioning structure, and a third positioning structure corresponding to the second positioning structure is provided on the reinforcement plate 51. The third positioning structure and the second positioning structure are both aligned and fixed with the first positioning structure. In an embodiment, the first positioning structure is a first positioning hole in the second mounting frame 32; the second positioning structure is a second positioning hole in the flexible printed circuit board 2; and the third positioning structure is a third positioning hole in the reinforcement plate 51. The third positioning hole, the second positioning hole and the first positioning hole can be fixed by snaps. In another embodiment, the first positioning structure is a positioning post on the second mounting frame 32; the second positioning structure is a second positioning hole on the flexible printed circuit board 2; the third positioning structure is a third positioning hole on the reinforcement plate 51. The third positioning hole, the second positioning hole and the positioning post are fixed by hotmelt or snap fastening. By aligning a positioning hole with a positioning hole or aligning a positioning hole with a positioning post, the installation procedure between the reinforcement plate, the isolation plate and the flexible printed circuit board can be simplified, and the assembly efficiency can be improved.

A fourth positioning structure can be provided on the overlapping portion of the flexible printed circuit board 2 and the second mounting frame 32, and a fifth positioning structure corresponding to the fourth positioning structure is provided on the reinforcement plate 51; and the fifth positioning structure is aligned and fixed with the fourth positioning structure. In an embodiment, the fourth positioning structure is a first bonding area in the flexible printed circuit board 2; the fifth positioning structure is a second bonding area in the reinforcement plate 51; the first bonding area of the flexible printed circuit board 2 is bonded to the second bonding area of the reinforcement plate 51 by a pressing process.

A resilient member is provided on the inner wall of the first mounting frame 31, and the aluminum bar 4 for connection is fixed in the first mounting frame 31 through the resilient member. In an embodiment, the resilient member is a first elastic piece, the first elastic piece is fixed to an inner wall of the first mounting frame, and a central part of the first elastic piece protrudes towards a central part of the first mounting frame. The first elastic piece can be provided on each surface of the inner wall of the first mounting frame, and when mounted, the aluminum bar for connection is placed above the first mounting frame, and pressure is applied to the aluminum bar for connection so that the aluminum bar for connection presses the resilient member and enters the first mounting frame. In this case, the resilient member provides elastic supporting force for the aluminum bar for connection, thereby firmly fixing the aluminum bar for connection in the first mounting frame. In another embodiment, the resilient member is a resilient snap, the resilient snap includes a joint end and a snap end, the joint end is connected to the inner wall of the first mounting frame, the snap end faces towards the aluminum bar for connection, and the snap end includes a protrusion extending toward the middle of the first mounting frame. Similarly, the resilient snap can be provided on the inner wall of the first mounting frame, and when mounted, the aluminum bar for connection is aligned with the first mounting frame, and then pressure is applied to the aluminum bar for connection to make the aluminum bar for connection press the resilient snap so that the snap end of the resilient snap extends toward the outer edge of the first mounting frame; when the aluminum bar for connection enters the first mounting frame, the side wall of the aluminum bar for connection does not contact with the snap end of the resilient snap, in this case, the pressing force of the aluminum bar for connection to the snap end of the resilient snap reduces or disappears, the snap end of the resilient snap resets, and the aluminum bar for connection is firmly fixed in the first mounting frame.

The isolation plate 3 is provided with a position restriction member to limit the aluminum bar 4 for connection to be removed from the first mounting frame 31 when the aluminum bar 4 for connection is embedded into the first mounting frame 31. In an example, a first connecting post is provided on the isolation plate near the first mounting frame 31, and one end of a restriction piece is set on the first connecting post and the other end of the restriction piece forms a free end, and the restricting piece can be rotated relative to the first connecting post under an external force, and before assembling the aluminum bar for connection, the free end of the restriction piece is rotated to attach the surface of the isolation plate, and then the aluminum bar for connection is put into the first mounting frame. Then, the free end of the restriction piece is turned to attach the aluminum bar for connection, and the restriction piece restricts the aluminum bar for connection to prevent the aluminum bar for connection from coming out of the first mounting frame. The position restriction member can be provided around the edge of the first mounting frame.

The isolation plate 3 is provided with an elastic device near the second mounting frame 32, which is configured to press the temperature measurement assembly 5 to keep the heat conducting pad 54 away from the isolation plate 3. In an example, the elastic device may include a second connecting post and a second elastic piece. the second connecting post is provided on the front side of the isolation plate and distributed around the edge of the second mounting frame. One end of the second elastic piece is attached to the second connecting post, and the other end of the second elastic piece is a free end, the free end is against the upper surface of the temperature measurement assembly and the free end presses the temperature measurement assembly towards the back side of the isolation plate. Specifically, the second connecting post can be provided on the front side of the isolation plate, and distributed around the edge of the second mounting frame, one end of the second elastic piece is connected with the second connecting post, and the other end is a free end, and the free end extends towards the back of the isolation plate, and the second elastic piece can rotate around the second connecting post. By turning the free end of the second elastic piece against the upper surface of the temperature measurement assembly, the temperature measurement assembly is pressed towards the back side of the isolation plate by using the free end of the second elastic piece, so that the heat conducting pad of the temperature measurement assembly is far away from the isolation plate, such that when the aluminum bar for connection is connected to the device to be monitored, the heat conducting pad can be closely attached to the device to be monitored.

The temperature monitoring apparatus further includes a conductive sheet 6, which connects the flexible printed circuit board 2 to the aluminum bar 4 for connection. The conductive sheet is separated from the temperature sensor so that the position of the temperature sensor can be set according to the position of the device to be monitored for thermal management, without being limited by the position of the conductive sheet, making the temperature sampling position more flexible.

The heat conducting pad is made of a resilient heat conducting material. For example, the resilient heat conducting material can be heat-conducting insulating elastic rubber. The heat-conducting insulating elastic rubber adopts a silicon rubber base material, and boron nitride, aluminum oxide and other ceramic particles as filler, having very good thermal conductivity, and the thermal conductivity thereof increases with the pressure. The heat conducting pad can also be a flexible heat conducting pad to complete the heat transfer between the heat generating part and the heat dissipating part, and at the same time play the role of vibration damping, insulation, sealing, etc., which can meet the design requirements of miniature and ultra-thin equipment. Of course, the material of the heat conducting pad of the present disclosure is not limited to the above embodiments, but all materials suitable for making the heat conducting pad to meet the requirements of thermal conductivity and deformation are included. The present disclosure uses a deformable thermal conductive material for the heat conducting pad, which allows the heat conducting pad to deform when in contact with the device to be monitored, such that the heat conducting pad attaches more closely to the device to be monitored, thereby providing better heat transfer.

The structure of the present disclosure is described below in connection with FIGS. 2-4.

Figure 2:
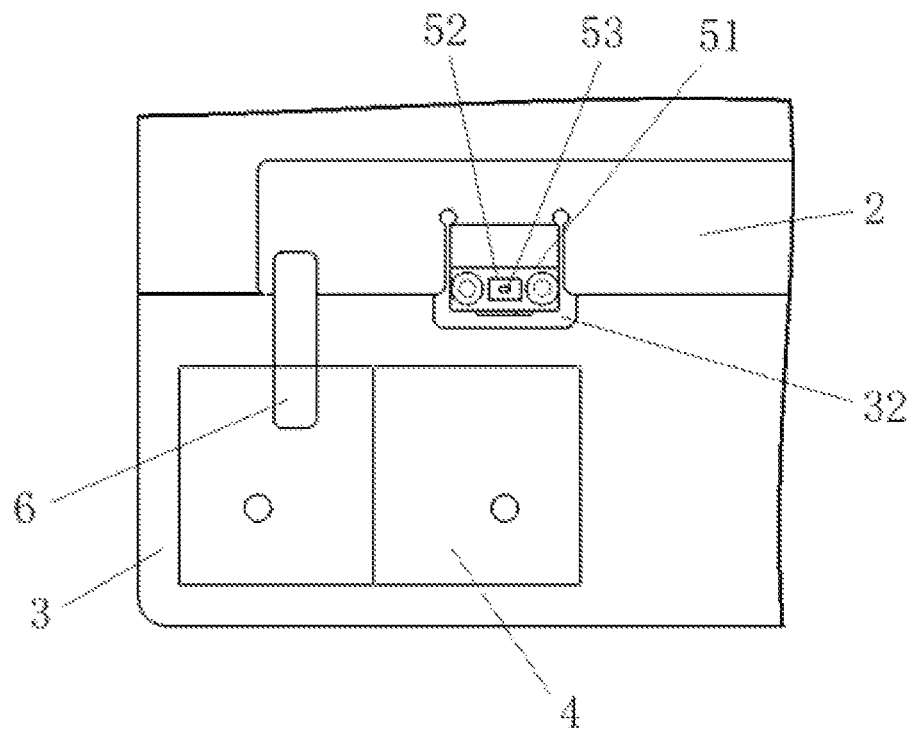
FIG. 2 is a schematic structure diagram of a temperature monitoring apparatus according to the present disclosure.

FIG. 2 shows a top view a structure of a temperature monitoring apparatus according to the present disclosure. The temperature monitoring apparatus is configured to monitor temperature of a device to be monitored. The temperature monitoring apparatus includes an isolation plate 3, an aluminum bar 4 for connection, a flexible printed circuit board 2, a conductive sheet 6 and a temperature measurement assembly 5. A first mounting frame 31 and a second mounting frame 32 are provided on the isolation plate 3, the aluminum bar 4 for connection is embedded into the first mounting frame 31, the flexible printed circuit board 2 is laid on the surface of the isolation plate 3 in a way that the flexible printed circuit board 2 partially overlaps with the second mounting frame 32, the temperature measurement assembly 5 is provided on the flexible printed circuit board 2 and at a position where the flexible printed circuit board 2 overlaps with the second mounting frame 32, and the conductive sheet 6 connects the flexible printed circuit board 2 and the aluminum bar 4 for connection.

In the temperature monitoring apparatus shown in FIG. 2, the temperature measurement assembly 5 includes a reinforcement plate 51, a heat conducting pad 54 and a temperature sensor 53, where the reinforcement plate 51 includes a first hollow part 52 and the heat conducting pad 54 is made of a resilient thermally conductive material. The flexible printed circuit board 2 is located between the reinforcement plate 51 and the heat conducting pad 54, and the temperature sensor 53 is provided in the first hollow part 52 of the reinforcement plate 51, specifically, the temperature sensor 53 can be welded to the flexible printed circuit board, and the temperature sensor 53 is in the first hollow part 52. In an embodiments, the connection relationship between the temperature measurement assembly 5, the isolation plate 3 and the flexible printed circuit board 2 can be as follows: the overlapping part of the flexible printed circuit board 2 and the second mounting frame 32 is used as the connection part of the flexible printed circuit board 2, and the connection part of the flexible printed circuit board 2 is fixed in the second mounting frame 32, so that a part of the connection part of the flexible printed circuit board 2 is exposed from the second mounting frame 32, and the heat conducting pad 54 is fixed on the part where the flexible printed circuit board 2 is exposed from the second mounting frame 32. The reinforcement plate 51 is fixed on the connection part of the flexible printed circuit board 2, and the temperature sensor 53 is welded to the connecting part of the flexible printed circuit board 2, so that part or all of the temperature sensor 53 extends into the first hollow part 52 of the reinforcement plate 51, the temperature sensor 53 and the heat conducting pad 54 are respectively located on two sides of the flexible printed circuit board 2 and on the same central line. After the aluminum bar 4 for connection is embedded into the first mounting frame 31, a part of the aluminum bar 4 for connection is exposed from the first mounting frame 31 and the part of the aluminum bar 4 for connection that is exposed from the first mounting frame 31 is connected to the device to be monitored, in this case, the heat conducting pad 54 is closely attached to the device to be monitored.

Figure 3:
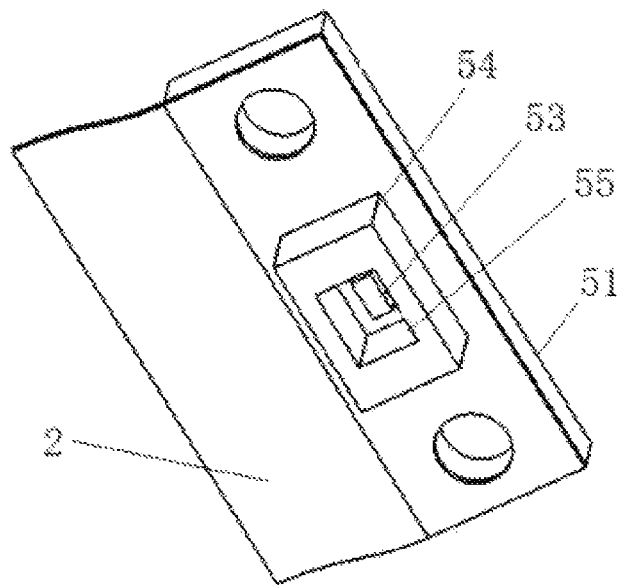
FIG. 3 is a schematic structure diagram of a temperature monitoring apparatus according to the present disclosure.

In the temperature monitoring apparatus shown in FIG. 3, the temperature measurement assembly 5 includes a reinforcement plate 51, a heat conducting pad 54 and a temperature sensor 53, where the heat conducting pad 54 is provided with a second hollow part 55, and the heat conducting pad 54 is made of a resilient thermally conductive material. The flexible printed circuit board 2 is located between the reinforcement plate 51 and the heat conducting pad 54, and the temperature sensor 53 is welded to the flexible printed circuit board, and the temperature sensor 53 is located in the second hollow part 55 of the heat conducting pad 54. Specifically, the connection relationship between the temperature measurement assembly 5, the isolation plate 3 and the flexible printed circuit board 2 can be as follows: an overlapping part of the flexible printed circuit board 2 and the second mounting frame 32 is used as the connecting part of the flexible printed circuit board 2, the connecting part of the flexible printed circuit board 2 is fixed in the second mounting frame 32 so that a part of the connecting part of the flexible printed circuit board 2 is exposed from the second mounting frame 32, the heat conducting pad 54 is fixed on the part of the flexible printed circuit board 2 that is exposed from the second mounting frame 32, the temperature sensor 53 is connected to the flexible printed circuit board 2, and the temperature sensor 53 is ensured to enter the second hollow part 55 of the heat conducting pad 54. The reinforcement plate 51 is fixed on the connecting part of the flexible printed circuit board 2. After the aluminum bar 4 for connection is embedded in the first mounting frame 31, a part of the aluminum bar 4 for connection is exposed from the first mounting frame 31, and the part of the aluminum bar 4 for connection exposed from the first mounting frame 31 is connected to the device to be monitored, in this case, the heat conducting pad 54 is closely attached to the device to be monitored.

The present disclosure provides a method of mounting the temperature measurement assembly 5, i.e., the temperature measurement assembly 5 is connected to the isolation plate 3 and the flexible printed circuit board 2. Specifically, a first positioning hole or a positioning post is provided on the edge of the second mounting frame 32, a second positioning hole is provided on the overlapping part of the second mounting frame 32 and the flexible printed circuit board 2, the second positioning hole corresponds to the first positioning hole or positioning post, and the third positioning hole corresponding to the second positioning hole is provided on the reinforcement plate 51; the third positioning hole and the second positioning hole are aligned with the first positioning hole or positioning post and fixed. The third positioning hole, the second positioning hole and the first positioning hole can be fixed by snaps; the third positioning hole, the second positioning hole and the positioning post can be fixed by hotmelt or snaps. When the temperature measurement assembly 5 is mounted in this way, the temperature measurement assembly 5 is fixed to the isolation plate 3, and when the aluminum bar 4 for connection on the isolation plate 3 is connected to the device to be monitored, the heat conducting pad 54 of the temperature measurement assembly 5 is closely attached to the device to be monitored.

The present disclosure further provides another method of mounting the temperature measurement assembly 5, i.e., the temperature measurement assembly 5 is connected to the flexible printed circuit board 2. The flexible printed circuit board 2 and the reinforcement plate 51 are fixed by a pressing process, specifically, a first bonding area is provided on the flexible printed circuit board 2 and a second bonding area is provided on the reinforcement plate 51 corresponding to the first bonding area, and the first bonding area is bonded to the second bonding area using a pressing process to fix the flexible printed circuit board 2 to the reinforcement plate 51. When the temperature measurement assembly 5 is mounted in this way, without the support of the isolation plate 3, the temperature measurement assembly 5 may vibrate with the flexible printed circuit board 2, which is not conducive to the attachment of the heat conducting pad 54 to the device to be monitored. In order to solve this problem, an elastic device can be provided on the isolation plate 3 close to the second mounting frame 32, and the elastic device is used to apply a pressure to the reinforcement plate 51 of the temperature measurement assembly 5, such that the heat conducting pad 54 is away from the isolation plate 3. In this way, when the aluminum bar 4 for connection is connected to the device to be monitored, it is ensured that the heat conducting pad 54 of the temperature measurement assembly 5 can closely attach to the device to be monitored. Specifically, the elastic device may include a second connecting post and a second elastic piece. The second connecting post is provided on the front side of the isolation plate 3 and distributed around the edge of the second mounting frame 32. One end of the second elastic piece is connected to the second connecting post, the other end of the second elastic piece is a free end, the free end extends to the back side of the isolation plate 3, the second elastic piece can rotate around the second connecting post. By rotating the free end of the second elastic piece against the upper surface of the temperature measuring component 5, by using the free end of the second elastic piece to press the temperature measurement assembly 5 to the back side of the isolation plate 3, the heat conducting pad 54 of the temperature measurement assembly 5 is away from the isolation plate 3.

In the present disclosure, the aluminum bar 4 for connection is fixedly connected to the first mounting frame 31. In an embodiment, an elastic member is provided on the inner wall of the first mounting frame 31. The elastic member can be an elastic piece or an elastic snap. When the aluminum bar 4 for connection is embedded into the first mounting frame 31, the side wall of the aluminum bar 4 for connection is pressed by the elastic piece, or the aluminum bar for connection is engaged with the elastic snap, so that the aluminum bar 4 for connection is fixed in the first mounting frame 31. In another embodiment, a position restriction member is set on the isolation plate 3 close to the first mounting frame 31. When the aluminum bar 4 for connection is embedded into the first mounting frame 31, the position restriction member is used to restrict the aluminum bar 4 for connection from back-out of the first mounting frame 31.

The temperature monitoring apparatus conducts the temperature of the device to be monitored by the heat conducting pad 54 and obtains the temperature value of the device to be monitored by using the temperature measurement assembly 5 near the heat conducting pad 54, which significantly shortens the heat transfer path and enables the temperature value monitored by the temperature measurement assembly 5 to be closer to the actual temperature of the device to be monitored, making the temperature sampling more accurate. The temperature of the device to be monitored is conducted directly by the heat conducting pad 54 without the aluminum bar 4 for connection to conduct heat, thus avoiding the problem that the temperature change of the aluminum bar 4 for connection is not consistent with the temperature change of the device to be monitored in the case of large discharge rate, resulting in the temperature collected indirectly through the aluminum bar 4 for connection not accurately reflecting the actual temperature of the device to be monitored.

Figure 4:
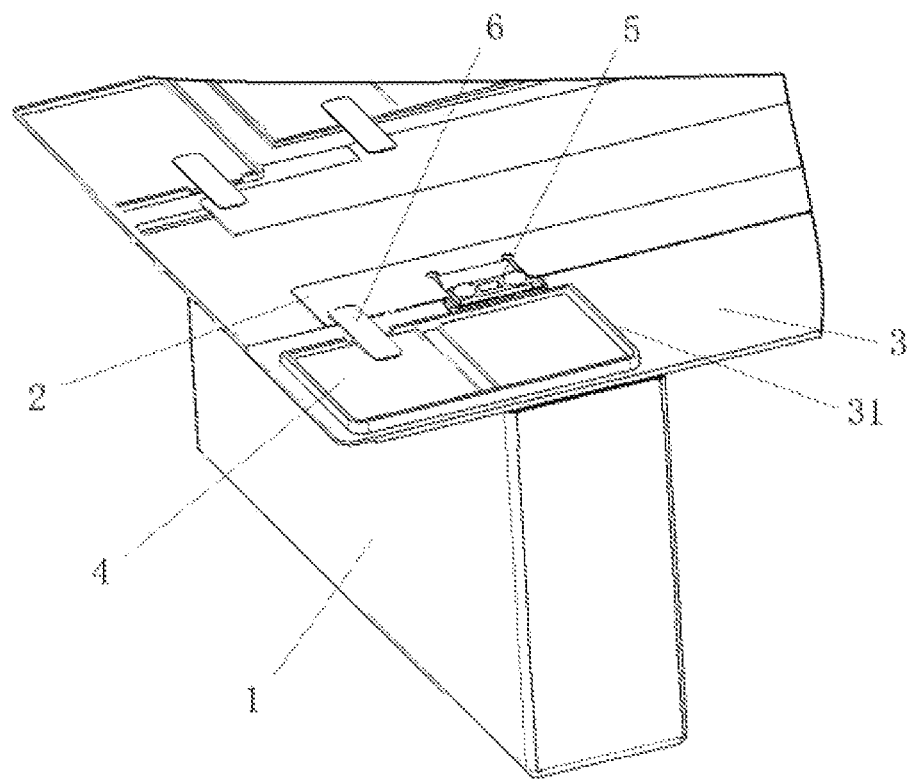
FIG. 4 is a schematic structure diagram of a battery module according to the present disclosure.
Figure 5:
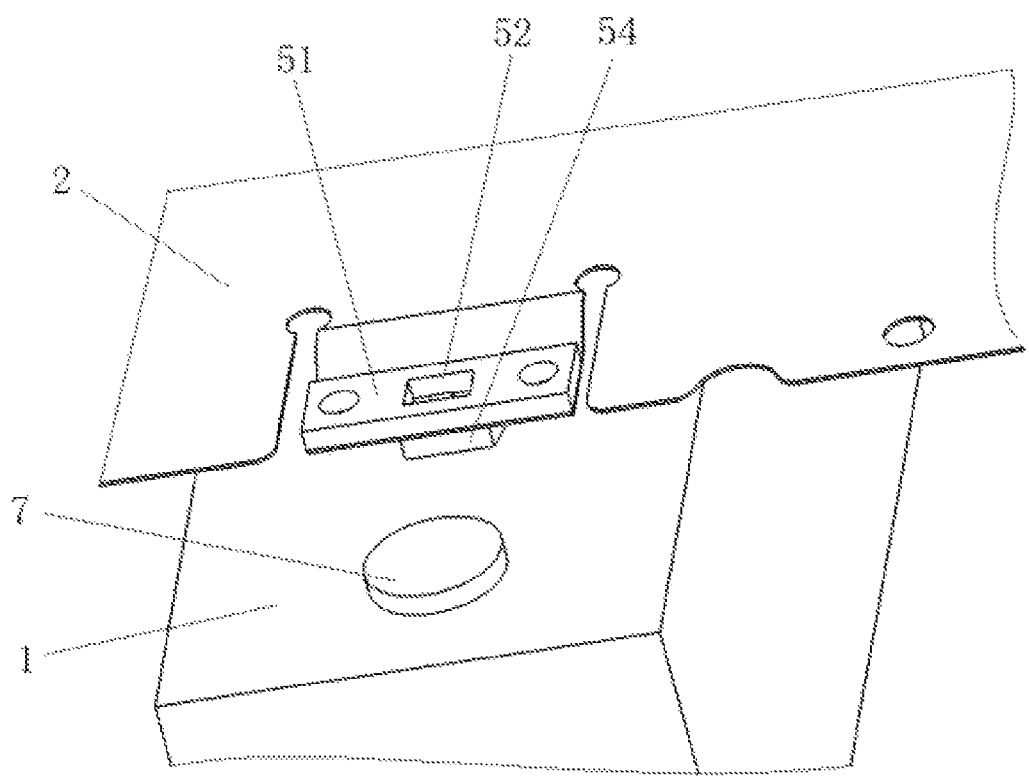
FIG. 5 is a schematic structure diagram of a battery module according to the present disclosure.

FIGS. 4 and 5 show the structure of a battery module according to the present disclosure in a perspective view. The battery module includes a battery cell 1 and a temperature monitoring apparatus as described above, which is used to monitor the temperature of the battery cell 1. The specific structure of the temperature monitoring apparatus is described above and in FIGS. 2-3 and will not be repeated here. The battery cell 1 of the battery module is provided with electrodes 7, the aluminum bar 4 of the temperature monitoring apparatus is connected to the battery cell 1 through the electrodes 7, and the heat conducting pad 54 of the temperature monitoring apparatus is closely attached to the battery cell 1.

The battery module transmits the heat of the battery cell 1 through the heat conducting pad 54, which shortens the heat transfer path and makes the temperature of the battery cell 1 collected by the temperature sensor 53 more accurate, and the position of the temperature sensor 53 is not limited by the position of the conductive sheet 6, so the position of the temperature sensor 53 is more flexible. In addition, since the temperature sensor 53 is separated from the conductive sheet 6, the risk of a short circuit between the fillet weld leg of the temperature sensor and the conductive sheet 6 due to the entry of water vapor when glue splits or layers in use is avoided, and there is no need to specially process a hollow part for welding the temperature sensor 53 on the conductive sheet 6, which simplifies the process of laminating the PI (Polyimide) film.

The above is only some embodiments of the present disclosure and is not intended to limit the present disclosure. Any modifications, equivalent replacements, improvements, etc. made within the spirit and principles of the present disclosure shall be included in the scope of protection of the present disclosure.

The invention claimed is:

1. A temperature monitoring apparatus, comprising an isolation plate, an aluminum bar for connection, a flexible printed circuit board and a temperature measurement assembly;

wherein a first mounting frame and a second mounting frame are on the isolation plate, the aluminum bar for connection is embedded into the first mounting frame, the flexible printed circuit board is laid on the surface of the isolation plate in a way that the flexible printed circuit board partially overlaps with the second mounting frame, the temperature measurement assembly is on the flexible printed circuit board and at an overlapping part of the flexible printed circuit board and the second mounting frame, a heat conducting pad of the temperature measurement assembly extends out the second mounting frame, and the temperature sensor of the temperature measurement assembly is close to the heat conducting pad;

wherein when the aluminum bar for connection is connected to a device to be monitored through a part of the aluminum bar for connection exposed from the first mounting frame, the heat conducting pad is attached to the device to be monitored.

2. The temperature monitoring apparatus according to claim 1, wherein the temperature sensor is connected to the flexible printed circuit board.

3. The temperature monitoring apparatus according to claim 1, wherein a first positioning structure is on a frame edge of the second mounting frame; a second positioning structure is on an overlapping part of the flexible printed circuit board and the second mounting frame, the second positioning structure corresponds to the first positioning structure; a third positioning structure corresponding to the second positioning structure is on the reinforcement plate; and the third positioning structure and the second positioning structure are both aligned and fixed with the first positioning structure.

4. The temperature monitoring apparatus according to claim 3, wherein the first positioning structure is a positioning hole in the second mounting frame; the second positioning structure is a second positioning hole in the flexible printed circuit board; and the third positioning structure is a third positioning hole in the reinforcement plate.

5. The temperature monitoring apparatus according to claim 4, wherein the third positioning hole, the second positioning hole and the first positioning hole are fixed by snaps.

6. The temperature monitoring apparatus according to claim 3, wherein the first positioning structure is a positioning post on the second mounting frame; the second positioning structure is a second positioning hole in the flexible printed circuit board; and the third positioning structure is a third positioning hole in the reinforcement plate.

7. The temperature monitoring apparatus according to claim 6, wherein the third positioning hole, the second positioning hole and the positioning post are fixed by hotmelt or snaps.

8. The temperature monitoring apparatus according to claim 1, wherein a fourth positioning structure is on an overlapping part of the flexible printed circuit board and the second mounting frame; and a fifth positioning structure corresponding to the fourth positioning structure is on the reinforcement plate, and the fifth positioning structure is aligned and fixed with the fourth positioning structure.

9. The temperature monitoring apparatus according to claim 8, wherein the fourth positioning structure is a first bonding area in the flexible printed circuit board; and the fifth positioning structure is a second bonding area in the reinforcement plate.

10. The temperature monitoring apparatus according to claim 9, wherein the first bonding area of the flexible printed circuit board is bonded to the second bonding area of the reinforcement plate by a pressing process.

11. The temperature monitoring apparatus according to claim 8, wherein the isolation plate is provided with an elastic device close to the second mounting frame, and the elastic device is configured to press the temperature measuring component enabling the heat conducting pad away from the isolation plate.

12. The temperature monitoring apparatus according to claim 1, wherein a resilient member is on an inner wall of the first mounting frame, and the aluminum bar for connection is fixed in the first mounting frame through the resilient member.

13. The temperature monitoring apparatus according to claim 12, wherein the resilient member is a first elastic piece, the first elastic piece is fixed to the inner wall of the first mounting frame, and a central part of the first elastic piece protrudes towards a central part of the first mounting frame.

14. The temperature monitoring apparatus according to claim 12, wherein the resilient member is a resilient snap, the resilient snap comprises a joint end and a snap end, the joint end is connected to an inner wall of the first mounting frame, the snap end faces the aluminum bar for connection, and the snap end is provided with a protrusion extending towards the central part of the first mounting frame.

15. The temperature monitoring apparatus according to claim 12, wherein the elastic device comprises a second connecting post and a second elastic piece, the second connecting post is on a front side of the isolation plate and distributed around an edge of the second mounting frame, one end of the second elastic piece is connected to the second connecting post and another end of the second elastic piece is a free end, the free end is against an upper surface of the temperature measurement assembly, and the free end presses the temperature measurement assembly to a back side of the isolation plate.

16. The temperature monitoring apparatus according to claim 1, wherein a position restriction member is on the isolation plate, and the position restriction member is configured to limit the aluminum bar for connection to be removed from the first mounting frame when the aluminum bar for connection is embedded in the first mounting frame.

17. The temperature monitoring apparatus according to claim 1, wherein the temperature monitoring apparatus further comprises a conductive sheet, the conductive sheet connects the flexible printed circuit board to the aluminum bar for connection.

18. A battery module, comprising a battery cell and a temperature monitoring apparatus according to claim 1, wherein an electrode is on the battery cell, the electrode is fixed to the aluminum bar for connection in the first mounting frame of the temperature monitoring apparatus, and the heat conducting pad of the temperature monitoring apparatus is closely attached to the battery cell.

* * * * *